United States Patent [19]
Forbes

[11] Patent Number: 6,166,401
[45] Date of Patent: Dec. 26, 2000

[54] FLASH MEMORY WITH MICROCRYSTALLINE SILICON CARBIDE FILM FLOATING GATE

[75] Inventor: Leonard Forbes, Corvallis, Oreg.

[73] Assignee: Micron Technology, Inc., Boise, Id.

[21] Appl. No.: 09/137,006

[22] Filed: Aug. 20, 1998

Related U.S. Application Data

[63] Continuation of application No. 08/790,603, Jan. 29, 1997, Pat. No. 5,801,401.

[51] Int. Cl.$^7$ .................................................. H01L 29/72
[52] U.S. Cl. .......................... 257/77; 257/314; 257/321; 257/407; 257/412; 257/741
[58] Field of Search ............................ 257/77, 314, 321, 257/407, 412, 741

[56] References Cited

U.S. PATENT DOCUMENTS

| | | | |
|---|---|---|---|
| 4,507,673 | 3/1985 | Aoyama et al. | 357/23 R |
| 5,021,999 | 6/1991 | Kohda et al. | 365/168 |
| 5,027,171 | 6/1991 | Reedy et al. | 357/23.5 |
| 5,111,430 | 5/1992 | Morie | 365/185 |
| 5,253,196 | 10/1993 | Shimabukuro | 365/45 |
| 5,260,593 | 11/1993 | Lee | 257/316 |
| 5,293,560 | 3/1994 | Harari | 365/185 |
| 5,317,535 | 5/1994 | Talreja et al. | 365/185 |
| 5,357,134 | 10/1994 | Shimoji | 257/325 |
| 5,388,069 | 2/1995 | Kokubo | 365/185 |
| 5,418,743 | 5/1995 | Tomioka et al. | 365/189.01 |
| 5,424,993 | 6/1995 | Lee et al. | 365/218 |
| 5,430,670 | 7/1995 | Rosenthal | 365/45 |
| 5,434,815 | 7/1995 | Smarandoiu et al. | 365/189.01 |
| 5,438,544 | 8/1995 | Makino | 365/185 |
| 5,449,941 | 9/1995 | Yamazaki et al. | 257/411 |
| 5,465,249 | 11/1995 | Cooper et al. | 365/149 |
| 5,467,306 | 11/1995 | Kaya et al. | 365/185.2 |
| 5,477,485 | 12/1995 | Bergemont et al. | 365/185.24 |
| 5,485,422 | 1/1996 | Bauer et al. | 365/168 |
| 5,493,140 | 2/1996 | Iguchi | 257/316 |
| 5,508,543 | 4/1996 | Hartstein et al. | 257/314 |
| 5,580,380 | 12/1996 | Liu et al. | 117/86 |
| 5,627,781 | 5/1997 | Hayashi et al. | 365/185.2 |
| 5,670,790 | 9/1997 | Katoh et al. | 257/14 |
| 5,801,401 | 9/1998 | Forbes | 257/77 |

FOREIGN PATENT DOCUMENTS

| | | | |
|---|---|---|---|
| 0139185 | 5/1985 | European Pat. Off. | G11C 17/00 |
| 0448118 | 9/1991 | European Pat. Off. | G11C 16/04 |
| 0750353 | 12/1996 | European Pat. Off. | H01L 29/86 |
| 3-222367 | 10/1991 | Japan | H01L 29/784 |
| 6-224431 | 8/1994 | Japan | H01L 29/784 |
| 6-302828 | 10/1994 | Japan | H01L 29/788 |
| 8-255878 | 10/1996 | Japan | H01L 27/10 |

OTHER PUBLICATIONS

Akasaki, I., et al., "Effects of AlN Buffer Layer on Crystallographic Structure and on Electrical and Optical Properties of GaN and Ga(1–x)Al(x)N [0< x (< or =) 0.4] Films Grown on Sapphire Substrate by MOVPE", *J. Crystal Growth*, 98, 209–219, (1989) Jan.

Alok, D., et al., "Electrical Properties of Thermal Oxide Grown on N–type 6H–Silicon Carbide", *Applied Physcis Letters*, 64, 2845–2846, (May 23, 1994).

Andrieux, M., et al., "Interface and Adhesion of PACVD SiC Based Films on Metals", *Supp. Le Vide: science, technique et applications*, 279, 212–214, (1996) Jan.

(List continued on next page.)

*Primary Examiner*—Edward Wojciechowicz
*Attorney, Agent, or Firm*—Schwegman, Lundberg, Woessner & Kluth, P.A.

[57] ABSTRACT

A memory is described which has memory cells that store data using hot electron injection. The data is erased through electron tunneling. The memory cells are described as floating gate transistors wherein the floating gate is fabricated using a conductive layer of microcrystalline silicon carbide particles. The microcrystalline silicon carbide particles are in contact such that a charge stored on the floating gate is shared between the particles. The floating gate has a reduced electron affinity to allow for data erase operations using lower voltages.

27 Claims, 3 Drawing Sheets

OTHER PUBLICATIONS

Bachmann, P., et al., "Influence on Surface Modifications on the Electronic Properties of CVD Diamond Films", *Diamond and Related Materials*, 5, 1378–1383, (1996) Jan.

Baglee, D., "Characteristics & Reliability of 100 Angstrom Oxides", *IEEE 22nd Annual Proc.: Reliability Physics*, Las Vegas, 152–155, (Apr. 3–5, 1984).

Baldwin, G.L., et al., "The Electronic Conduction Mechanism of Hydrogenated Nanocrystalline Silicon Films", *Proc. 4th Int. Conf. on Solid–State and Int. Circuit Tech, Beijing*, 66–68, (1995) Jan.

Bauer, M., et al., "A Multilevel–Cell 32 Mb Flash Memory", *Digest IEEE*, Solid–State Circuits Conf.,, 440, (1995) Jan.

Beheim, G., et al., "Magnetron Plasma Etching of SiC for Microstructures", *Proc: SPIE—Integrated Optics and Microstructures III*, San Jose, CA, 82–86, (Jan. 29, 1996).

Bengtsson, S., et al., "Applications of Aluminum Nitride Films Deposited by Reactive Sputtering to Silicon–On–Insulator Materials", *Japanese J. Applied Physics*, 35, 4175–4181, (1996) Jan.

Benjamin, M., et al., "UV Photoemission Study of Heteroepitaxial AlGaN Films Grown on 6H–Sic", *Applied Surface Science*, 104/105, 455–460, (1996) Jan.

Bermudez, V., et al., "The Growth and Properties of Al and AlN Films on GaN(0001)–(1×1)", *J. Applied Physics*, 79, 110–119, (Jan. 1996).

Boeringer, D.W., et al., "Avalanche amplification of multiple resonant tunneling through parallel silicon microcrystallites", *Physical Rev. B*, 51, 13337–13343, (1995) Jan.

Casey, H., et al., "Low Interface Trap Density for Remote Plasma Deposited SiO2 on n–type GaN", *Applied Phys. Lett.*, 68, 1850–1852, (Mar. 1996).

Choi, J., et al., "Effect of Deposition Conditions and Pretreatments on the Microstructure of MPECVD Diamond Thin Films", *Materials Chemistry and Physics*, 45, 176–179, (1996) Jan.

Clarke, G., et al., "The Infrared Properties of Magnetron–Sputtered Diamond–Like Thin Films", *Thin Solid Films*, 280, 130–135, (1996) Jan.

Compagnini, G., et al., "Spectroscopic Characterization of Annealed Si(1–x)C(x) Films", *J. Materials Res.*, 11, 2269–2273, (Sep. 1996).

Dartnell, N., et al., "Reactive Ion Etching of Silicon Carbide (Si(x)C(1–x))", *Vacuum*, 46, 349–355, (1995) Jan.

Demichelis, F., et al., "Influence of Doping on the Structural and Optoelectronic Properties of Amorphous and Microcrystalline Silicon Carbide", *Journal of Applied Physics*, 72, 1327–1333, (Aug. 15, 1992).

Demichelis, F., et al., "Physical Properties of Undoped and Doped Microcrystalline SiC:H Deposited By PECVD", *Materials Research Society Symposium Proceedings*, 219, Anaheim, CA, 413–418, (Apr. 30–May 3, 1991).

Dipert, B., et al., "Flash Memory Goes Mainstream", *IEEE Spectrum*, 30, 48–52, (1993) Jan.

Edelberg, E., et al., "Visible Luminescence from Nanocrystallie silicon films produced by plasma enhanced chemical vapor deposition", *Appl. Phys. Lett.*, 68, 1415–1417, (1996) Jan.

Fissel, A., et al., "Epitaxial Growth of SiC Thin Films on Si–stabilized alph–SiC (0001) at Low Temperatures by Solid–source Molecular Beam Epitaxy", *Journal of Crystal Growth*, 154, 72–80, (1995) Jan.

Friedrichs, P., et al., "Interface Properties of Metal–Oxide–Semiconductor Structures on N–Type 6H and 4H–SiC", *J. Applied Physics*, 79, 7814–7819, (May 15, 1996).

Fujii, T., et al., "Bonding Structures in Highly Photoconductive a–SiC:H Films Deposited by Hybrid–Plasma Chemical Vapor Deposition", *Journal of Non–Crystalline Solids*, 198–200, 577–581, (1996) Jan.

Goetzberger, A., et al., *Applied Solid State Science: Advances in Materials and Device Research*, R. Wolfe, ed., Academic Press, New York, Including p. 233, (1969) Jan.

Graul, J., et al., "Growth Mechanism of Polycrystalline beta–SiC Layers on Silicon Substrate", *Applied Phys. Lett.*, 21, 67–69, (Jul. 1972).

Hamakawa, Y., et al., "Optoelectronics and Photovoltaic Applications of Microcrystalline SiC", *Materials Research Society Symposium Proceedings*, 164, Boston, MA, 291–301, (Nov. 29–Dec. 1, 1989).

He, Z., et al., "Ion–beam–assisted Deposition of Si–carbide Films", *Thin Solid Films*, 260, 32–37, (1995) Jan.

Hu, G., "Will Flash Memory Replace Hard Disk Drive?", IEEE Electron Devices Meeting , Session 24, (Dec. 13, 1994).

Hwang, J., et al., "High Mobility beta–SiC Epilayer Prepared by Low–pressure Rapid Thermal Chemical Vapor Deposition on a (100) Silicon Substrate", *Thin Solid Films*, 272, 4–6, (1996) Jan.

Hybertsen, M.S., "Absorption and Emission of Light in Nanoscale Silicon Structures", *Phys. Rev. Lett.*, 72, 1514–1517, (1994) Jan.

Jou, S., et al., "Electron Emission Characterization of Diamond Thin Films Grown from a Solid Carbon Source", *Thin Solid Films*, 280, 256–261, (1996) Jan.

Jung, T.S., et al., "A 3.3V, 128Mb Multi–Level NAND Flash Memory for Mass Storage Applications", 1996 IEEE Solid–State Circuits Conf., Digest of Technical Papers, 512, (1996) Jan.

Kamata, T., et al., "Substrate Current Due to Impact Ionization in MOS–FET", *Japan. J. Appl. Phys.*, 15, 1127–1134, (Jun. 1976).

Kato, M., et al., "Read–Disturb Degradation Mechanism due to Electron Trapping in the Tunnel Oxide for Low–voltage Flash Memories", IEEE Electron Device Meeting, 45–48, (1994) Jan.

Kothandaraman, M., et al., "Reactive Ion Etching of Trenches in 6H–SiC", *J. Electronic Materials*, 25, 875–878, (1996) Jan.

Kumbhar, A., et al., "Growth of Clean Amorphous Silicon–Carbon Alloy Films by Hot–Filament Assisted Chemical Vapor Deposition Technique", *Applied Phys. Lett*, 66, 1741–1743, (Apr. 1995).

Lakshmi, E., et al., "Interface–State Characteristics of GaN/GaAs MIS Capacitors", *Solid–State Electronics*, 25, 811–815, (1982) Jan.

Lanois, F., et al., "Angle Etch Control of Silicon Carbide Power Devices", *Applied Phys. Lett.*, 69, 236–238, (Jul. 1996).

Lau, S., et al., "Optoelectronic Properties of Highly Conductive Microcrystalline SiC Produced by Laser Crystallization of Amorphous SiC", *J. of Non–Crystalline Solids*, 198–200, 907–910, (1996) Jan.

Leggieri, G., et al., "Laser Ablation Deposition of Silicon Carbide Films", *Applied Surface Science*, 96–98, 866–869, (1996) Jan.

Lei, T., et al., "Epitaxial Growth and Characterization of Zinc–Blende Gallium Nitride on (001) Silicon", *J. Appl. Phys.*, 71, 4933–4943, (May 1992).

Liu, J., et al., "Formation of SiC Films on Silicon Field Emitters", *Materials Res. Soc. Symp. Proc.*, 311, San Francisco, CA, (Apr. 13–15, 1993).

Liu, J., et al., "Modification of Si Field Emitter Surfaces by Chemical Conversion to SiC", *J. Vac. Sci. Technology*, B 12, 717–721, (1994).

Luo, J., et al., "Localized Epitaxial Growth of Hexagonal and Cubic SiC Films on Si by Vacuum Annealing", *Applied Phys. Lett.*, 69, 916–918, (Aug. 1996).

Maury, F., et al., "Chemical Vapor Co–Deposition of C and SiC at Moderate Temperature for the Synthesis of Compositionally Modulated Si(x)C(1–x) Ceramic Layers", *Surface and Coatings Technology*, 76–77, 119–125, (1995) Jan.

McLane, G., et al., "High Etch Rates of SiC in Magnetron Enhanced SF(6) Plasmas", *Applied Phys. Lett.*, 68, 3755–3757, (Jun. 1996).

Mogab, C., et al., "Conversion of Si to Epitaxial SiC by Reaction with C(2)H(2)", *J. Applied Physics*, 45, 1075–1084, (Mar. 1974).

Molnar, R., et al., "Growth of Gallium Nitride by Electron–Cyclotron Resonance Plasma–Assisted Molecular–Beam Epitaxy: The Role of Charged Species", *J. Appl. Phys.*, 76, 4587–4595, (1994) Jan.

Muller, K., et al., "Trench Storage Node Technology for Gigabit DRAM Generations", *Digest IEEE Int. Electron Devices Meeting*, San Francisco, CA, 594–597, (Dec. 1996).

Nemanich, R., et al., "Negative Electron Affinity Surfaces of Aluminum Nitride and Diamond", *Diamond and Related Materials*, 5, 790–796, (1996) Jan.

Ohkawa, M., et al., "A 98 mm 3.3V 64Mb Flash Memory with FN–NOR type 4–Level Cell", IEEE International Solid–State Circuits Conference, 36–37, (1996) Jan.

Ouyang, M., et al., "Deposition of Diamond–Like Carbon Films via Excimer Laser Ablation of Polybutadiene", *Materials Science and Engineering*, B39, 228–231, (1996) Jan.

Pankove, J., et al., "Photoemission from GaN", *Applied Phys. Lett.*, 25, 53–55, (1974) Jan.

Papadas, C., et al., "Modeling of the Intrinsic Retention Characteristics of FLOTOX EEPROM Cells Under Elevated Temperature Conditions", *IEEE Transaction on Electron Devices*, 42, 678–682, (Apr. 1995).

Patuwathavithane, C., et al., "Oxidation Studies for 6H–SiC", *Proc: 4th Int. Conf. on Amorphous and Crystalline Silicon Carbide IV*, Santa Clara, CA, 163–169, (Oct. 9–11, 1991).

Pereyra, I., et al., "Wide Gap a–Si(1–x)C(x): H Thin Films Obtained Under Starving Plasma Deposition Conditions", *J. Non–Crystalline Solids*, 201, 110–118, (1996) Jan.

Pollack, S., "Electron Transport Through Insulating Thin Films", *Appl. Solid–State Science*, 1, 345–355, (1969) Jan.

Prendergast, J., "FLASH or DRAM: Memory Choice for the Future", IEEE Electron Device Meeting, Session 25, Phoenix, AZ, (1995) Jan.

Rahman, M., et al., "Preparation and Electrical Properties of An Amorphous SiC/ Crystalline Si p(+)n Heterostructure", *Japanese J. Applied Physics*, 23, 515–524, (May 1984).

Schmidt, I., et al., "Low Temperature Diamond Growth Using Fluorinated Hydrocarbons", *Diamond and Related Materials*, 5, 1318–1322, (1996) Jan.

Schoenfeld, O., et al., "Formation of Si Quantum dots in Nanocrystalline silicon", *Proc. 7th Int. Conf. on Modulated Semiconductor Structures*, Madrid, 605–608, (1995) Jan.

Serre, C., et al., "Ion–Beam Synthesis of Amorphous SiC Films: Structural Analysis and Recrystallization", *J. Appl. Phys.*, 79, 6907–6913, (May 1996).

Shimabukuro, R.L., et al., "Circuitry for Artificial Neural Networks with Non–volatile Analog Memories", IEEE Int'l Symp. on Circuits and Systems, 2, 1217–1220, (1989) Jan.

Shimabukuro, R.L., et al., "Dual–Polarity Nonvolatile MOS Analogue Memory (MAM) Cell for Neural–Type Circuitry", *Electronics Lett.*, 24, 1231–1232, (Sep. 15, 1988).

Sim, S., et al., "A New Planar Stacked Technology (PST) for Scaled and Embedded DRAMs", *Digest IEEE Int. Electron Devices Meeting*, San Francisco, CA, 504–507, (Dec. 1996).

Suh, K.D., et al., "A 3.3 V 32 Mb NAND Flash Memory with Incremental Step Pulse Programming Scheme", *IEEE J. Solid–State Circuits*, 30, 1149–1156, (Nov. 1995).

Suzaki, Y., et al., "Quantum Size Effects of a–Si(:H)/ a–SiC(:H) Multilayer Films Prepared by rf Sputtering", *Abstracts of Papers Published in the Int. J. Japenese Soc. for Precision Engineering*, 28, Abstract of Paper in vol. 60, 182, (Jun. 1994).

Svirkova, N., et al., "Deposition Conditions and Density–of–States Spectrum of a–Si(1–x)C(x) :H Films Obtained by Sputtering", *Semiconductors*, 28, 1164–1169, (Dec. 1994).

Sze, S.M., "Physics of Semiconductor Devices", *Wiley–Interscience 2d Ed.*, New York, 482, (1981) Jan.

Takeuchi, K., et al., "A Double–Level–V Select Gate Array Architecture for Multilevel NANAD Flash Memories", *IEEE Journal of Solid–State Circuits*, 31, 602–609, (Apr. 1996).

Tarui, Y., "Flash Memory Features Simple Structure, Superior Integration", *JEE*, 30, 84–87, (Sep. 1993).

Tenhover, M., et al., "DC–Magnetron Sputtered Silicon Carbide", *Materials Res. Soc. Symp. Proc.*, 356, Boston, MA, 227–232, (Nov. 28–Dec. 2, 1994).

Thomas, J., et al., "Plasma Etching and Surface Analysis of a–SiC :H Films Deposited by Low Temperature Plasma Enhanced Chemical Vapor Deposition", *Materials Res. Soc. Symp. Proc.*, 334, Boston, MA, 445–450, (Nov. 29–Dec. 2, 1993).

Tiwari, S., et al., "A silicon nanocrystal based memory", *Appl. Physics Lett.*, 68, 1377–1379, (1996) Jan.

Tiwari, S., et al., "Volatile and Non–Volatile Memories in Silicon with Nano–Crystal Storage", *Int'l Electron Devices Meeting: Technical Digest*, Washington, DC, 521–524, (Dec. 1995).

Tsu, R., et al., "Slow Conductance oscillations in nanoscale silicon clusters of quantum dots", *Appl. Phys. Lett.*, 65, 842–844, (1994) Jan.

Tsu, R., et al., "Tunneling in Nanoscale Silicon Particles Embedded in an SiO/sub/2 Matrix", *Abstract, IEEE Device Research Conference*, 178–179, (1996) Jan.

Tucker, C., et al., "Ion–beam–assisted Deposition of Non-hydrogenated a–Si:C Films", *Can. J. Physics*, 74, 97–101, (1996) Jan.

Vodakov, Y., et al., "Diffusion and Solubility of Impurities in Silicon Carbide", In: *Silicon Carbide*, R.C. Marshall, et al., eds., Univ. of South Carolina Press, 508–519, (1973) Jan.

Wahab, Q., et al., "3C–SiC / Si / 3C–SiC Epitaxial Trilayer Films Deposited on Si (111) Substrates by Reactive Magnetron Sputtering", *J. Materials Res.*, 10, 1349–1351, (Jun. 1995).

Watanabe, A., et al., "SiC Thin Film Preparation by ArF Excimer Laser Chemical Vapor Deposition. Part 1: Rate of Photolysis of Alkylsilanes by ArF Excimer Laser and their Decomposition Products", *Thin Solid Films*, 274, 70–75, (1996) Jan.

Wolter, S., et al., "Textured Growth of Diamond on Silicon via in situ Carburization and Bias–Enhanced Nucleation", *Appl. Phys. Lett.*, 62, 1215–1217, (Mar. 1993).

Wu, K., et al., "The Growth and Characterization of Silicon/Silicon Carbide Heteroepitaxial Films on Silicon Substrates by Rapid Thermal Chemical Vapor Deposition", *Japanese J. Appl. Phys.*, 35, 3836–3840, (1996) Jan.

Yamaguchi, Y., et al., "Properties of Heteroepitaxial 3C–SiC Films Grown by LPCVD", *Digest of Tech. Papers: 8th Int. Conf. on Solid–State Sensors and Actuators and Eurosensors IX*, vol. 2, Stockholm, Sweden, 190–193, (Jun. 1995).

Yamanashi, H., et al., "Deposition of Silicon Compound Thin Films in DC Discharge Plasma Using Hydrogen–Hexamethyldisilane Gas Mixture", *Proc.: Int. Symp. on Surfaces and Thin Films of Electronic Materials. Bull. of the Res. Institute of Electronics*, Shizuoka University, 30, 95–98, (1995) Jan.

Ye, Q., et al., "Resonant Tunneling via Microcrystalline–silicon quantum confinement", *Physical Rev. B*, 44, 1806–1811, (1991).

Yee, A., et al., "The Effect of Nitrogen on Pulsed Laser Deposition of Amorphous Silicon Carbide Films: Properties and Structure", *J. Materials Research*, 11, 1979–1986, (1996).

Yih, C.M., et al., "A Consistent Gate and Substrate Current Model for Sub–Micron MOSFET'S by Considering Energy Transport", Int'l Symp. on VLSI Tech., Systems and Applic., Taiwan, 127–130, (1995).

Zhao, X., et al., "Nanocrystalline Si: a material constructed by Si quantum dots", 1st Int. Conf. on Low Dimensional Structures and Devices, Singapore, 467–471, (1995).

FLASH MEMORY WITH MICROCRYSTALLINE SILICON CARBIDE FILM FLOATING GATE

This application is a continuation of U.S. Ser. No. 08/790,603 filed Jan. 29, 1997 now U.S. Pat. No. 5,801,401.

TECHNICAL FIELD OF THE INVENTION

The present invention relates generally to memory circuits and in particular the present invention relates to floating gate memory cells.

BACKGROUND OF THE INVENTION

Non-volatile memory such as electrically programmable read-only memory (EPROM) and electrically-erasable programmable read-only memory (EEPROM) are extensively used for storing data in computer systems. EPROM and EEPROM comprise a large number of memory cells having electrically isolated gates, referred to as floating gates. Data is stored in the memory cells in the form of charge on the floating gates. Charge is transported to or removed from the floating gates by program and erase operations, respectively.

Another type of non-volatile memory is flash memory. Flash memory is a derivative of EPROM and EEPROM. Although flash memory shares many characteristics with EPROM and EEPROM, the current generation of flash memory differs in that erase operations are done in blocks.

A typical flash memory comprises a memory array which includes a large number of memory cells arranged in row and column fashion. Each of the memory cells include a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Flash memories have the potential of replacing hard storage disk drives in computer systems. The advantages would be replacing a complex and delicate mechanical system with a rugged and easily portable small solid-state non-volatile memory system. There is also the possibilities that given their very high potential densities that given more speed of operation particularity in the erase operation that flash memories might be used to replace DRAMs. Flash memories might then have the ability to fill all memory needs in future computer systems.

One flash memory is described in S. Tiwari et al., "Volatile and Non-volatile Memories in Silicon with Nano-Crystal Storage," Abstr. of IEEE Int. Electron Device Meeting, pp. 521–524 (1995), which uses confined nano-crystal particles in a floating gate memory cell. The individual nano-crystals are not in electrical contact with each other, and therefore cannot share a common charge. As referred to in the art, the memory has a thin gate oxide and uses a tunnel-tunnel process for writing and reading data. A memory designed to use a tunnel-tunnel process typically has a gate oxide thickness of about 15–20 Å which can be degraded over time resulting in a defective memory.

For the reasons stated above, and for other reasons stated below which will become apparent to those skilled in the art upon reading and understanding the present specification, there is a need in the art for a fast flash memory having a floating gate memory cell which in which the floating gate has a reduced electron affinity, can share a common charge, or does not use a tunnel-tunnel process.

SUMMARY OF THE INVENTION

The above mentioned problems with memory devices and other problems are addressed by the present invention and which will be understood by reading and studying the following specification. A memory cell is described which uses a film of microcrystalline silicon carbide as a floating gate.

In particular, the present invention describes an integrated circuit memory cell comprising a transistor having a source, drain, gate and a floating gate, the floating gate comprising a film of microcrystalline silicon carbide particles. The microcrystalline silicon carbide particles are in contact to form a conductive film.

In another embodiment, an integrated circuit field effect transistor is described. The transistor comprises a conductive channel separating source and drain regions, a floating gate comprising a conductive film of microcrystalline silicon carbide particles. The floating gate is located adjacent the channel and separated therefrom by a first insulating layer. A control gate is provided adjacent the floating gate and separated therefrom by a second insulating layer.

In yet another embodiment, a memory device is described which has an array of memory cells. Each of the memory cells comprise a source region, a drain region, a conductive channel separating the source and drain regions, and a floating gate comprising a conductive film of microcrystalline silicon carbide particles. The floating gate is located adjacent the channel and separated therefrom by a first insulating layer. A control gate is also located adjacent the floating gate and separated therefrom by a second insulating layer. The memory further comprises addressing circuitry for addressing the array of memory cells, and control circuitry for controlling read and write operations of the memory device.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
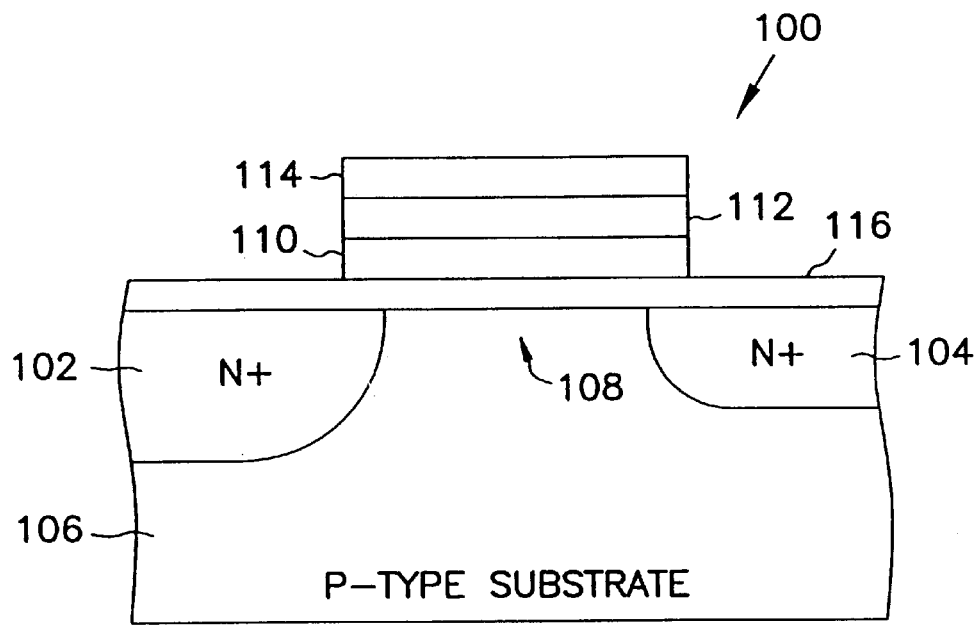
FIG. 1 is a cross-sectional view of a prior art memory cell.

FIG. 1 is a cross-sectional view of a typical memory cell, such as a used in a flash memory. Memory cell 100 comprises a region of a source 102 and a region of a drain 104. Source 102 and drain 104 are constructed from an N+ type of high impurity concentration which are formed in a P-type semiconductor substrate 106 of low impurity concentration. Source 102 and drain 104 are separated by a predetermined space of a channel region 108. Memory 100 further includes a floating gate 110 formed by a first polysilicon (poly) layer, and a control gate 114 formed by a second poly layer. Floating gate 110 is isolated from control gate 114 by an interpoly dielectric layer 112 and from channel region 108 by a thin oxide layer 116 approximately 100 Angstroms (Å) thick.

Figure 2:
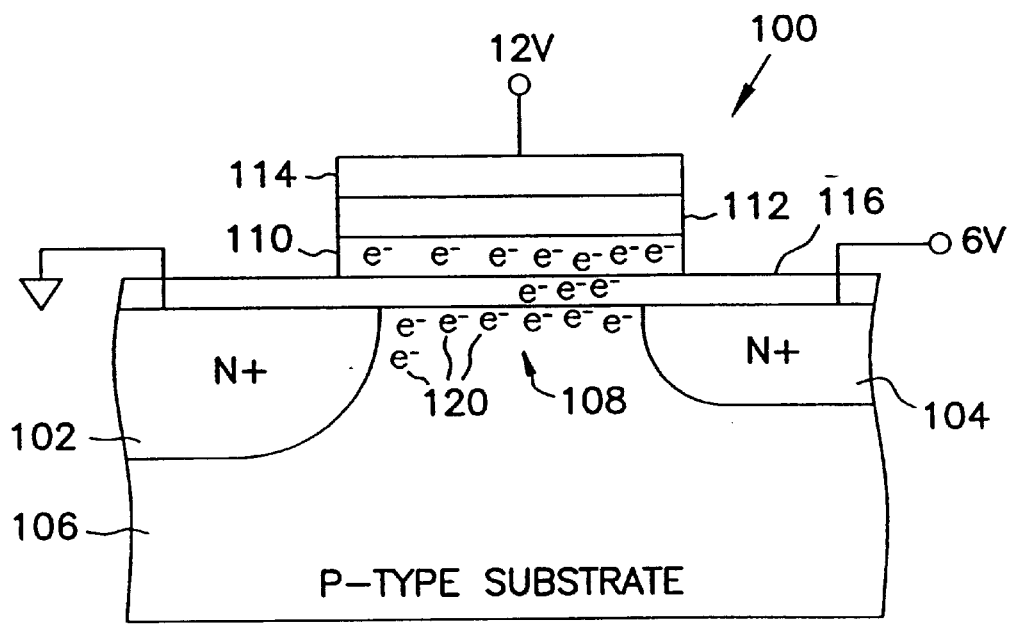
FIG. 2 is the memory cell of FIG. 1 during programming.

FIG. 2 is the memory cell of FIG. 1 during a programming operation. During programming, a positive programming voltage of about 12 volts is applied to control gate 114. This positive programming voltage attracts electrons 120 from P-type substrate 106 and causes them to accumulate at the surface of channel region 108. A voltage on drain 104 is increased to about 6 volts, and the source 102 is connected to ground. As the drain-to-source voltage increases, electrons 120 flow from source 102 to drain 104 via channel region 108. As electrons 120 travel toward drain 104, they acquire substantially large kinetic energy and are referred to as hot electrons.

The voltages at control gate 114 and drain 104 creates an electric field in oxide layer 116, this electric field attracts the hot electrons and accelerates them toward the floating gate 110. At this point, floating gate 110 begins to trap and accumulate the hot electrons and starts a charging process. Gradually, as the charge on the floating gate increases, the electric field in oxide layer 116 decreases and eventually loses it capability of attracting any more of the hot electrons to the floating gate 110. At this point, floating gate 110 is fully charged. The negative charge from the hot electrons collected in the floating gate 110 raises the cell's threshold voltage (Vt) above a logic 1 voltage. When a voltage on control gate 114 is brought to a logic 1 during a read operation, the cell will barely turn on. Sense amplifiers are used in the memory to detect and amplify the state of the memory cell during a read operation. Thus, data is read from a memory cell based upon its "on" characteristics.

Electrons are removed from the floating gate to erase the memory cell. Many memories, including flash memories, use Fowler-Nordheim (FN) tunneling to erase a memory cell. The erase procedure is accomplished by electrically floating the drain, grounding the source, and applying a high negative voltage (−12 volts) to the control gate. This creates an electric field across the gate oxide and forces electrons off of the floating gate which then tunnel through the gate oxide. For a general description of how a flash memory having floating gate memory cells operates see B. Dipert et al., "Flash Memory Goes Mainstream," IEEE Spectrum, pp. 48–52 (October 1993), and incorporated herein by reference.

One of the difficulties with flash memories has been the erase operation using Fowler-Nordheim tunneling. The erase operation requires high voltages, and is relatively slow. Further, an erratic over erase can be induced as a result of the very high erase voltages used. These very high erase voltages are a fundamental problem arising from the high electron affinity of bulk silicon or large grain polysilicon particles used as the floating gate. This creates a very high tunneling barrier. Even with high negative voltages applied to the gate, a large tunneling distance is experienced with a very low tunneling probability for electrons attempting to leave the floating gate. This results in long erase times since the net flux of electrons leaving the gate is low. Thus, the tunneling current discharging the gate is low. In addition, other phenomena result as a consequence of this very high negative voltage. Hole injection into the oxide is experienced which can result in erratic over erase, damage to the gate oxide itself, and the introduction of trapping states.

The solution to these problems is to use a floating gate having a lower electron affinity for electrons. Thus, a lower barrier is provided for electrons to escape over, or through by tunneling. Lower barriers require lower voltages as a result of smaller tunneling distances for the electrons during the erase operation. This results in much faster erase times and much less damage. The possibility of secondary problems occurring in the gate oxide are also reduced, such as electron traps and hole injection.

The present invention describes a transistor using microcrystalline silicon carbide as the floating gate material. Silicon carbide is a wide bandgap material with a bandgap energy of around 2.1 eV. In contrast, silicon has a bandgap energy of 1.2 eV. Silicon carbide also has an electron affinity of around 3.7–3.8 eV, in contrast to the 4.2 eV of silicon. The lower electron affinity is the characteristic which is utilized in flash memories, and is accentuated in microcrystalline samples which have an even lower electron affinity. The use of a lower electron affinity material for the floating gate serves to reduce the barrier at the interface with the tunneling gate oxide, reduce the tunneling distance and greatly increase the tunneling probability.

Figure 3:
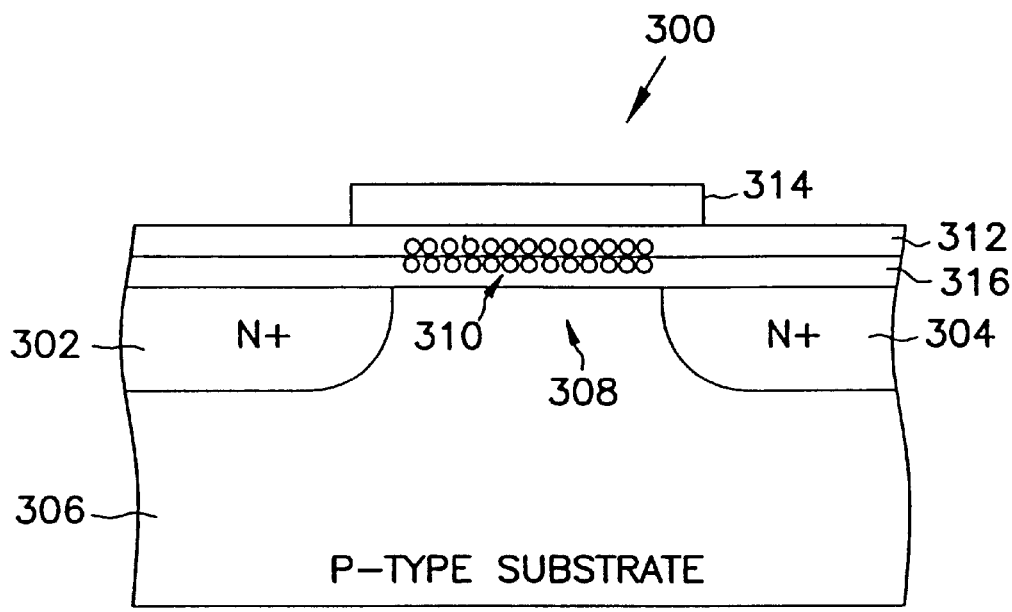
FIG. 3 is a cross-section of a memory cell incorporating a film of microcrystalline silicon carbide as a floating gate.

FIG. 3 shows a cross section of a transistor 300 where the normal polysilicon floating gate has been replaced by a thin film of microcrystalline silicon carbide. Transistor 300 comprises a region of a source 302 and a region of a drain 304. Source 302 and drain 304 are constructed from an N+ type of high impurity concentration which are formed in a P-type semiconductor substrate 306 of low impurity concentration. Source 302 and drain 304 are separated by a predetermined space of a channel region 308. Transistor 300 further includes a floating gate 310 formed as a micocrystalline silicon carbide film. A control gate 314 is formed by a polysilicon layer. Floating gate 310 is isolated from control gate 314 by an interpoly dielectric layer 312 and from channel region 308 by a thin gate oxide layer 316.

Although the particles may not be formed as a uniform sphere, they can be described as having a general diameter of approximately 30 to 100 Angstroms. These films can be deposited by a plasma enhanced chemical vapor deposition (CVD) method or other enhanced CVD techniques known to those skilled in the art. The floating gate can be patterned and etched using standard techniques similar to those used to form the polysilicon floating gates in conventional devices. The microcrystalline silicon carbide particles and film can be doped to have n-type conductivity. The requirements for conductivity are however not great as this film is not used for conductive paths elsewhere in the memory device. Only enough conductivity is required to allow for a redistribution of the carriers within the floating gate.

Using these silicon carbide microcrystals in a conductive film is distinctly different than other techniques of using isolated silicon nanocrystals to observe trapping of single electrons on these isolated crystals, as described above. Here the microcrystals are used as a conductive film to replace the coarse grain polysilicon floating gate structure in a conventional flash memory structured with hot electron injection as the write mechanism and tunneling as the erase mechanism.

Figure 4:
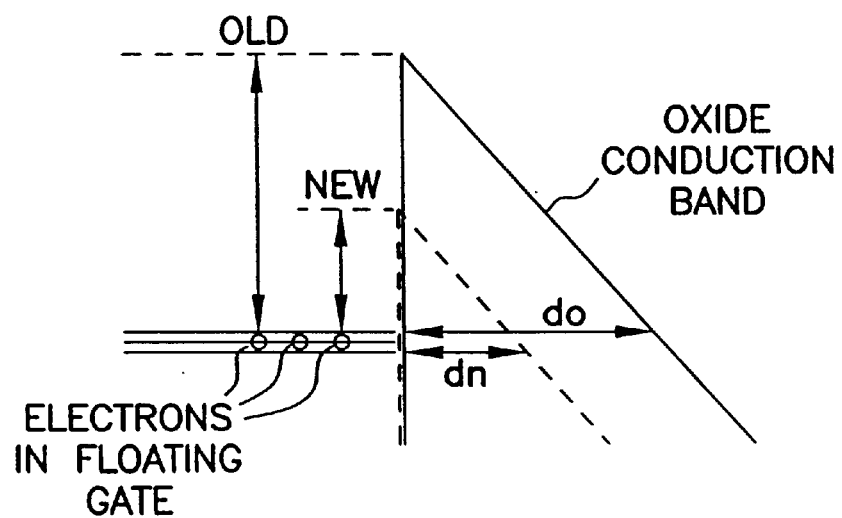
FIG. 4 is a graph of barrier height versus tunneling distance.

FIG. 4 shows how the reduced electron affinity and reduced barrier reduces the distance electrons trapped on the floating gate have to tunnel through during the erase operation to escape from the gate. Tunneling distance "do" represents the tunneling distance experienced in typical transistor having a polysilicon floating gate. Tunneling distance "dn" represents the tunneling distance experienced in a transistor having a floating gate as described in FIG. 3. Even a small reduction in the tunneling distance results in a huge increase in the tunneling probability and current leaving the gate since the tunneling probability is an exponential function of the reciprocal of the tunneling distance. This results in much larger gate discharge currents and much smaller erase time for flash memory devices, or equivalently for the same erase time a huge reduction in voltages and electric fields in the device structure. The result then is a memory cell with a much faster and much easier erase operation due to the lower barrier height for the electrons to tunnel through in leaving the floating gate structures.

Figure 5:
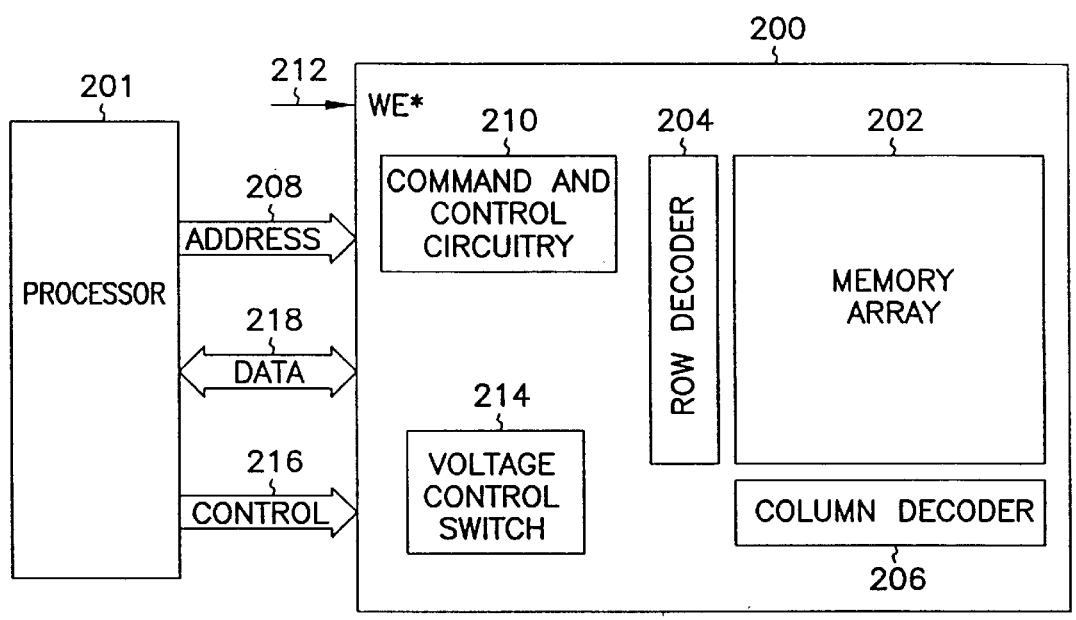
FIG. 5 is a simplified block diagram of a typical flash memory incorporating the present invention.

FIG. 5 is a simplified block diagram of a typical system having a flash memory incorporating the present invention. Memory 200 comprises a memory array 202 having memory cells. A row decoder 204 and a column decoder 206 are designed to decode and select addresses provided on address lines 208 to access appropriate memory cells. Command and control circuitry 210 is designed to control the operation of memory 200 in response to incoming command and control signals from a processor 201, including a write enable signal 212 (WE*), control lines 216 and data communication lines 218. Furthermore, a voltage control switch 214 is provided to apply appropriate voltages to the memory cells during programming operation. It will be appreciated by those skilled in the art that the memory of FIG. 5 has been simplified for the purpose of illustrating the present invention and is not intended to be a complete description of a flash memory.

CONCLUSION

A memory device is described which has fast read, write and erase operations. The memory uses memory cell floating gate transistors with a floating fabricated of a conductive layer of micro-size silicon carbide crystals. Although the floating gate is conductive, it need only be conductive enough to allow for a redistribution of carriers in the floating gate structure itself. The memory cell has a lower electron affinity than conventional memory cells having a floating gate fabricated from polysilicon.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of storing data in a memory cell, comprising:
   applying a first voltage to a control gate of a memory cell, the memory cell further comprising a source, a drain and a floating gate, wherein the floating gate comprises a conductive film of microcrystalline silicon carbide particles;
   applying a second voltage to the drain of the memory cell;
   applying a third voltage to the source of the memory cell; and
   trapping electrons on the floating gate.

2. The method of claim 1, wherein applying a first voltage, applying a second voltage and applying a third voltage comprise a first voltage of about 12V, a second voltage of about 6V and a third voltage of ground.

3. The method of claim 1, wherein applying a first voltage, applying a second voltage and applying a third voltage comprise a first voltage of less than about 12V, a second voltage of less than about 6V and a third voltage of ground.

4. A method of storing data in a memory cell, comprising:
   applying a first voltage to a control gate of a memory cell, the memory cell further comprising a source, a drain and a floating gate, wherein the floating gate comprises a conductively-doped film of microcrystalline silicon carbide particles;
   applying a second voltage to the drain of the memory cell;
   applying a third voltage to the source of the memory cell; and
   trapping electrons on the floating gate.

5. A method of erasing data in a memory cell, comprising:
   applying a first voltage to a control gate of a memory cell, the memory cell further comprising a source, a drain and a floating gate, wherein the floating gate comprises a conductive film of microcrystalline silicon carbide particles;
   applying a second voltage to the source of the memory cell;
   electrically floating the drain of the memory cell; and
   removing electrons from the floating gate.

6. The method of claim 4, wherein applying a first voltage and applying a second voltage comprise a first voltage of about −12V and a second voltage of ground.

7. (New) The method of claim 4, wherein applying a first voltage and applying a second voltage comprise a first voltage having a magnitude of less than about −12V and a second voltage of ground.

8. A method of erasing data in a memory cell, comprising:
   applying a first voltage to a control gate of a memory cell, the memory cell further comprising a source, a drain and a floating gate, wherein the floating gate comprises a conductively-doped film of microcrystalline silicon carbide particles;
   applying a second voltage to the source of the memory cell;
   electrically floating the drain of the memory cell; and
   removing electrons from the floating gate.

9. A system, comprising
   a processor; and
   a memory device in communication with the processor, wherein the memory device comprises a plurality of memory cells, further wherein each of the plurality of memory cells comprises a transistor having a source, a drain, a control gate and a floating gate, still further wherein the floating gate comprises a film of microcrystalline silicon carbide particles.

10. The system of claim 9, wherein the memory device performs at least one function in the system selected from the group consisting of storage and random access memory.

11. The system of claim 9, wherein the film of microcrystalline silicon carbide particles comprises a plurality of silicon carbide particles each having a general diameter in a range of about 30 to 100 Angstroms.

12. The system of claim 9, wherein the film of microcrystalline silicon carbide particles is conductively doped.

13. A system, comprising
   a processor;
   a storage device in communication with the processor, wherein the storage device comprises a first plurality of memory cells; and
   a memory device in communication with the processor, wherein the memory device comprises a second plurality of memory cells;

wherein each of the first plurality of memory cells and the second plurality of memory cells comprises a transistor having a source, a drain, a control gate and a floating gate, further wherein the floating gate comprises a film of microcrystalline silicon carbide particles.

14. A system, comprising:
a processor; and
a memory device coupled to the processor, wherein the memory device comprises:
- a plurality of memory cells, each of the plurality of memory cells comprising:
  - a source region;
  - a drain region;
  - a conductive channel separating the source and drain regions;
  - a first insulating layer located adjacent the conductive channel;
  - a second insulating layer located adjacent the first insulating layer;
  - a control gate located adjacent the second insulating layer; and
  - a floating gate interposed between the first insulating layer and the second insulating layer, wherein the floating gate comprises a conductive film of microcrystalline silicon carbide particles;
- addressing circuitry for addressing the plurality of memory cells; and
- control circuitry for controlling read and write operations of the memory device in response to command and control signals from the processor.

15. The system of claim 14, wherein the first insulating layer and the second insulating layer are comprised of oxide.

16. The system of claim 14, wherein the memory device performs at least one function in the system selected from the group consisting of storage and random access memory.

17. The system of claim 14, wherein the conductive film of microcrystalline silicon carbide particles comprises a plurality of silicon carbide particles each having a general diameter in a range of about 30 to 100 Angstroms.

18. The system of claim 14, wherein the film of microcrystalline silicon carbide particles is conductively doped.

19. A system, comprising
a processor;
a storage device in communication with the processor, wherein the storage device comprises:
- a first plurality of memory cells;
- a first addressing circuitry for addressing the plurality of memory cells; and
- a first control circuitry for controlling read and write operations of the storage device in response to command and control signals from the processor; and a memory device in communication with the processor, wherein the memory device comprises:
- a second plurality of memory cells;
- a second addressing circuitry for addressing the plurality of memory cells; and
- a second control circuitry for controlling read and write operations of the memory device in response to command and control signals from the processor;

wherein each of the first plurality of memory cells and the second plurality of memory cells comprises:
- a source region;
- a drain region;
- a conductive channel separating the source and drain regions;
- a first insulating layer located adjacent the conductive channel;
- a second insulating layer located adjacent the first insulating layer;
- a control gate located adjacent the second insulating layer; and
- a floating gate interposed between the first insulating layer and the second insulating layer, wherein the floating gate comprises a conductive film of microcrystalline silicon carbide particles.

20. A memory device, comprising
a plurality of memory cells, each of the plurality of memory cells comprising:
- a source region;
- a drain region;
- a conductive channel separating the source and drain regions;
- a first insulating layer located adjacent the conductive channel;
- a second insulating layer located adjacent the first insulating layer;
- a control gate located adjacent the second insulating layer; and
- a floating gate interposed between the first insulating layer and the second insulating layer, wherein the floating gate comprises a conductive film of microcrystalline silicon carbide particles;
addressing circuitry for addressing the plurality of memory cells; and
control circuitry for controlling read and write operations of the memory device.

21. The memory device of claim 20, wherein the conductive film of microcrystalline silicon carbide particles comprises a plurality of silicon carbide particles each having a general diameter in a range of about 30 to 100 Angstroms.

22. The memory device of claim 20, wherein the conductive film of microcrystalline silicon carbide particles is conductively doped.

23. A memory device, comprising
a plurality of memory cells, each of the plurality of memory cells comprising:
- a source region;
- a drain region;
- a conductive channel separating the source and drain regions;
- a first insulating layer located adjacent the conductive channel;
- a second insulating layer located adjacent the first insulating layer;
- a control gate located adjacent the second insulating layer; and
- a floating gate interposed between the first insulating layer and the second insulating layer, wherein the floating gate comprises a film of microcrystalline silicon carbide particles, further wherein the film of microcrystalline silicon carbide particles comprises a plurality of silicon carbide particles each having a general diameter in a range of about 30 to 100 Angstroms, still further wherein the film of microcrystalline silicon carbide particles is conductively doped;
addressing circuitry for addressing the plurality of memory cells; and
control circuitry for controlling read and write operations of the memory device.

24. A memory cell, comprising
a source region;
a drain region;

a conductive channel separating the source and drain regions;

a first insulating layer located adjacent the conductive channel;

a second insulating layer located adjacent the first insulating layer;

a control gate located adjacent the second insulating layer; and a floating gate interposed between the first insulating layer and the second insulating layer, wherein the floating gate comprises a conductive film of microcrystalline silicon carbide particles.

25. The memory cell of claim 24, wherein the conductive film of microcrystalline silicon carbide particles comprises a plurality of silicon carbide particles each having a general diameter in a range of about 30 to 100 Angstroms.

26. The memory cell of claim 24, wherein the conductive film of microcrystalline silicon carbide particles is conductively doped.

27. A memory cell, comprising a source region;

a drain region;

a conductive channel separating the source and drain regions;

a first insulating layer located adjacent the conductive channel;

a second insulating layer located adjacent the first insulating layer;

a control gate located adjacent the second insulating layer; and a floating gate interposed between the first insulating layer and the second insulating layer, wherein the floating gate comprises a film of microcrystalline silicon carbide particles, further wherein the film of microcrystalline silicon carbide particles comprises a plurality of silicon carbide particles each having a general diameter in a range of about 30 to 100 Angstroms, still further wherein the film of microcrystalline silicon carbide particles is conductively doped.

* * * * *

UNITED STATES PATENT AND TRADEMARK OFFICE
CERTIFICATE OF CORRECTION

PATENT NO.: 6,166,401

DATED: Dec. 26, 2000

INVENTOR(S) : Forbes

It is certified that error appears in the above-identified patent and that said Letters Patent is hereby corrected as shown below:

In column 1, line 65, delete first occurrence of "which".

In column 5, line 35, insert --gate-- after "floating".

In column 6, line 27, delete "(New)".

Signed and Sealed this

First Day of May, 2001

*Attest:*

NICHOLAS P. GODICI

*Attesting Officer*   Acting Director of the United States Patent and Trademark Office